(12) United States Patent
Yamaguchi et al.

(10) Patent No.: US 6,268,681 B1
(45) Date of Patent: *Jul. 31, 2001

(54) METHOD AND CIRCUIT FOR DRIVING PIEZOELECTRIC TRANSFORMER

(75) Inventors: Shuuji Yamaguchi; Naoki Furuhashi, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/334,548

(22) Filed: Jun. 16, 1999

(30) Foreign Application Priority Data

Jun. 19, 1998 (JP) .................................. 10-173181

(51) Int. Cl.[7] .................................................... H01L 41/08
(52) U.S. Cl. ...................................................... 310/316.01
(58) Field of Search .............................. 310/316.01, 317, 310/319, 358, 359

(56) References Cited

U.S. PATENT DOCUMENTS

| | | | |
|---|---|---|---|
| 4,459,505 | * 7/1984 | Lim | 310/316.01 X |
| 5,329,200 | * 7/1994 | Zaitsu | 310/316.01 |
| 5,705,879 | * 1/1998 | Abe et al. | 310/359 |
| 5,731,652 | * 3/1998 | Shimada | 310/316.01 |
| 5,739,622 | * 4/1998 | Zaitsu | 310/316.01 |
| 5,796,213 | * 8/1998 | Kawasaki | 310/316.01 X |
| 5,894,184 | * 4/1999 | Furuhashi et al. | 310/316.01 |
| 5,942,835 | * 8/1999 | Furuhashi et al. | 310/316.01 |
| 6,052,300 | * 4/2000 | Bishop et al. | 310/316.01 X |

* cited by examiner

*Primary Examiner*—Mark O. Budd
(74) *Attorney, Agent, or Firm*—Laff, Whitesel & Saret, Ltd.; J. Warren Whitesel

(57) ABSTRACT

To provide a piezoelectric transformer drive method and a drive circuit which is capable of preventing breakdown of the piezoelectric transformer due to excessive oscillation on its activation and of obtaining a high efficiency. Controller controlling the load power to a constant value is provided. The controller is controlled in such a manner that the driving of the piezoelectric transformer is initiated at a frequency higher than the resonating frequency on its activation and thereafter the drive frequency is gradually lowered without passing through the resonating frequency of the piezoelectric transfer on its activation.

19 Claims, 16 Drawing Sheets

F I G. 5
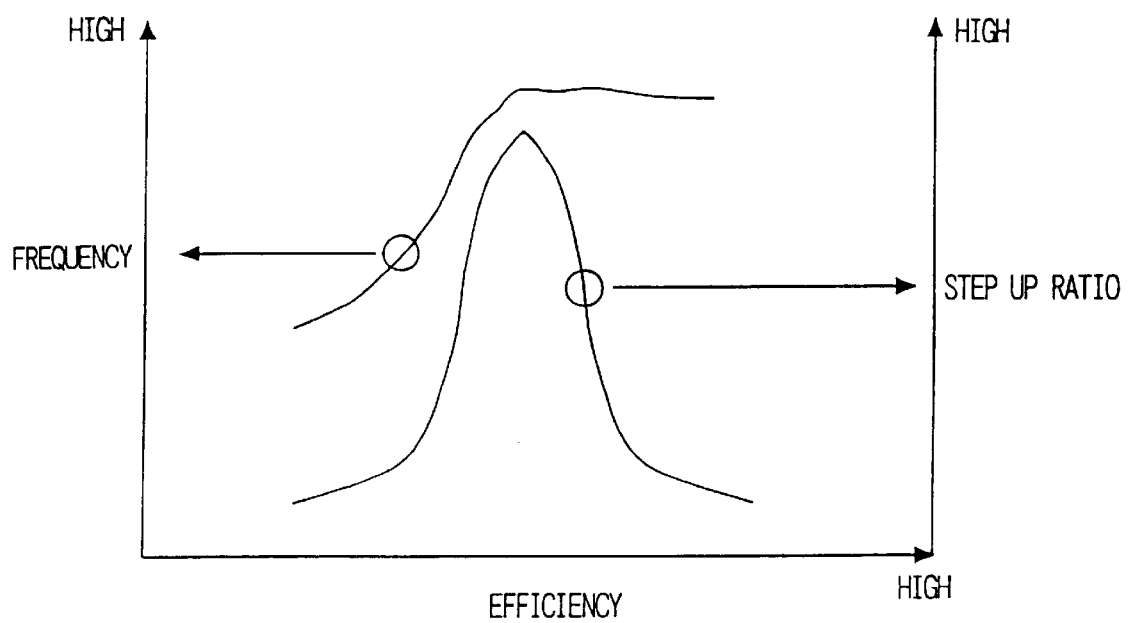

METHOD AND CIRCUIT FOR DRIVING PIEZOELECTRIC TRANSFORMER

FIELD OF THE INVENTION

The present invention relates to a piezoelectric transformer drive circuit and in particular to a drive method and circuit which is preferably used for driving of a piezoelectric transformer which is connected with a cold cathode tube having a high variation in impedance as a load.

BACKGROUND OF THE INVENTION

A prior art activating device in which the frequency of a voltage applied to a piezoelectric element is preset to a frequency which is higher than an intended drive frequency and is higher than the resonating frequency and is lower than the harmonics of the resonating frequency, and is gradually lowered is disclosed in, for example, Japanese patent Kokai publication JP-A-3-22873. This is a driving device of an ultrasonic motor for preventing the occurrence of uncomfortable noise on activation of the ultrasonic motor. This prior art device will be described with reference to FIG. 16.

A plurality of electrostrictive elements of polarized piezoelectric material are disposed on the surface of an ultrasonic motor stator 34. These plurality of electrostrictive elements are separated into two groups, section A and section B, which are disposed in such a manner that they are out of phase by 90 degrees to each other. The electrostrictive elements of sections A and B are provided with electrodes 47a and 47b, respectively. An electrode 47c is disposed on electrostrictive elements which are insulated from the electrodes 47a and 47b so as to output a detecting signal depending upon the oscillating condition of the electrostrictive elements.

When a voltage from a power source is applied to this circuit, a microcomputer 40 outputs data concerning an upper limit of the driving frequency to a VCO 38 via a D/A converter 39. This causes a voltage of the upper limit frequency to be applied to the electrode 47a via a frequency divider 37, amplifier 36 and a coil 35. Simultaneously with this, a voltage having a frequency which is out of phase by 90 degrees from that applied to the electrode 47a is applied to the electrode 47b. The electrode 47b is driven by a frequency given by "a shift" register 44 having inputs connected to both sides of the frequency divider 37, and an output connected to an amplifier 45 and further to a coil 46.

However, since the upper limit frequency is far from the optimal drive frequency, the ultrasonic motor is not activated and no signal is obtained from the electrode 47c. Accordingly, a band pass filter (B.P.F.) 43 outputs a 0 level signal, which is fed to the microcomputer 40 via a rectifier 42 and an A/D converter 41. The signal is compared with a predetermined reference value Ds in the microcomputer 40 for detecting that desired driving is not performed. In response to this result, the microcomputer 40 outputs data for presetting the drive frequency to a frequency which is lower by 0.1 KHz.

A series of above-mentioned operations is repeated until a signal which is input to the microcomputer from the electrode 47c via the band pass filter 43, rectifier 42 and the A/D converter 41 becomes the predetermined reference value Ds, until then drive frequency is continued to lower.

The value of Ds is preset in such a manner that the signal input to the microcomputer 40 is higher than the reference value Ds when the drive frequency is in the vicinity of the resonating frequency after lowering of the drive frequency is continued. When the signal input to the microcomputer 40 is actually higher than the reference value Ds, the microcomputer 40 outputs data for increasing the drive frequency by 0.1 KHz. When the signal input to the microcomputer 40 is lower than the reference value Ds again, the microcomputer 40 outputs data for lowering the frequency correspondingly. Such a series of operations enables control of drive frequency so that the signal input to the microcomputer 40 converges to the vicinity of the reference value Ds.

Since the frequency of the voltage applied to the piezoelectric material is not identical with the resonating frequency on activation of the ultrasonic motor by the above-mentioned operation, uncomfortable noise does not occur.

SUMMARY OF THE DISCLOSURE

However, various problems have been encountered in the course of investigations toward the present invention. Namely, the above-mentioned drive circuit has a problem as follows:

As shown in FIG. 16, this drive circuit determines whether the drive frequency is elevated or lowered in the microcomputer 40. This determination is made based upon the magnitude of the signal from the oscillating electrostrictive elements.

However, frequency control can not be performed based upon only a signal from an oscillating state of piezoelectric elements in case of, for example, a piezoelectric transformer inverter which is loaded with a cold cathode tube.

The reason will now be described.

The cold cathode tube has a negative impedance. The relation between the output voltage and the input current is shown in FIG. 12. The output voltage and input current both increase in a range a in FIG. 12 before starting of lighting. The input current increases as the output current decreases in a range b in FIG. 12 after lighting. The output voltage exhibits almost no decrease although the input current increases in a range c in FIG. 12 in which the input current increases.

A cold cathode tube in a back light for LCD (liquid crystal display) is generally used in the range c in FIG. 12 in which the output voltage hardly decreases even if the input current increases.

The current is proportional to the brightness in a practical range of the cold cathode tube. It has been found from FIG. 12 that the voltage hardly changes even if the current changes in the practical range of the cold cathode tube.

In the piezoelectric transformer, the signal which can be readily taken out from the oscillating piezoelectric transformer is an output voltage. From the foregoing, the piezoelectric transformer inverter can not be controlled at a high precision with a voltage which is a signal from oscillating state of the piezoelectric transformer.

Accordingly, a unique system for controlling a piezoelectric transformer inverter which is loaded with a cold cathode tube has been demanded.

Therefore, it is an object of the present invention to provide a method and circuit for driving a piezoelectric transformer which is capable of preventing the breaking down of the piezoelectric transformer caused by excessive oscillation on activation thereof and simultaneously of achieving high efficiency in the method and circuit for driving the piezoelectric transformer having a feature of high load dependency and which is loaded with a cold cathode tube having a high variation in impedance. Other objects and advantages of the present invention will become apparent from the entire disclosure including the following description.

According to an aspect of the present invention, the present invention is characterized in that it comprises control means to control the load power constant, wherein driving of said piezoelectric transformer is initiated at a frequency which is higher than the resonating frequency of the piezoelectric transformer on activation thereof, followed by gradually lowering the drive frequency, and drive frequency of the piezoelectric transformer is controlled so that it will not pass through the resonating frequency of said piezoelectric transformer on activation thereof.

In a second aspect of the present invention, the control means is characterized in that it controls the load current to a constant value at a frequency higher than the resonating frequency of the piezoelectric transformer.

Other aspects of the present invention will become apparent in the following description.

BRIEF DESCRIPTION OF THE DRAWINGS

FIG. 5 A graph showing the relationship between the efficiency, step up ratio and frequency of the piezoelectric transformer.

FIG. 11 Diagrams explaining a second embodiment of the present invention.

PREFERRED EMBODIMENTS OF THE INVENTION

Now, modes of embodying the present invention will be described. For understanding of the principle of the present invention, the background technology will be described. As aforementioned, a signal which can be readily taken out from the piezoelectric transformer in an oscillating condition is an output voltage. From the foregoing, control of the piezoelectric transformer inverter at a high precision cannot be achieved with a voltage which is the signal from the oscillating state. Accordingly, a unique system for controlling the piezoelectric transformer inverter which is loaded with a cold cathode tube has been demanded.

A method for measuring the value of a current which is in a proportional relationship with the brightness in the practical range and for controlling the current to a constant value is preferable for the purpose of controlling the brightness of the cold cathode tube to a constant value, since it is possible to reduce the circuit scale.

The system for controlling the current of the piezoelectric transformer inverter which is loaded with the cold cathode tube should provide for the prevention of the breaking down of the piezoelectric transformer due to the excessive oscillation. One of the preventive methods will now be described.

Now, a mode of occurrence of the piezoelectric transformer breakdown due to excessive oscillating speed on activation and the requirement of the frequency on drive starting will be described.

Figure 12:
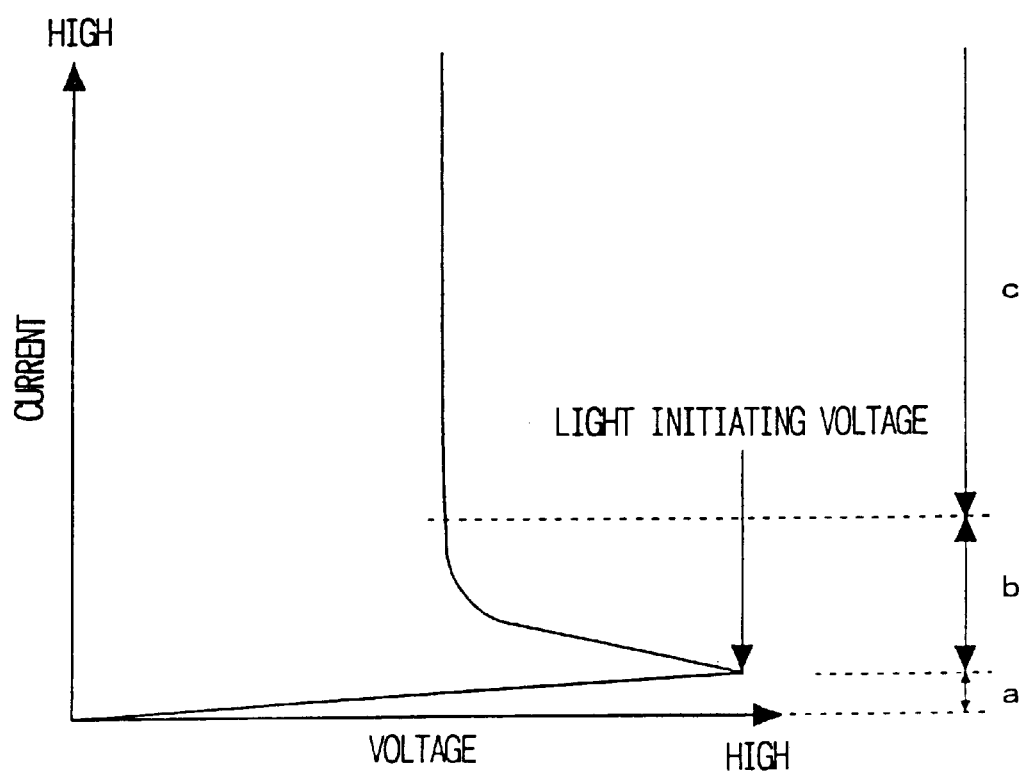
FIG. 12 A graph explaining the principle and background technology of the present invention.

The cold cathode tube has characteristics in which there is a time lag on starting of discharge and its impedance is very high before initiation of lighting and the impedance is rapidly lowered due to starting of the discharge after lighting. The rapid change in the characteristics which is shown in FIG. 12 is due to this characteristics.

Figure 10:
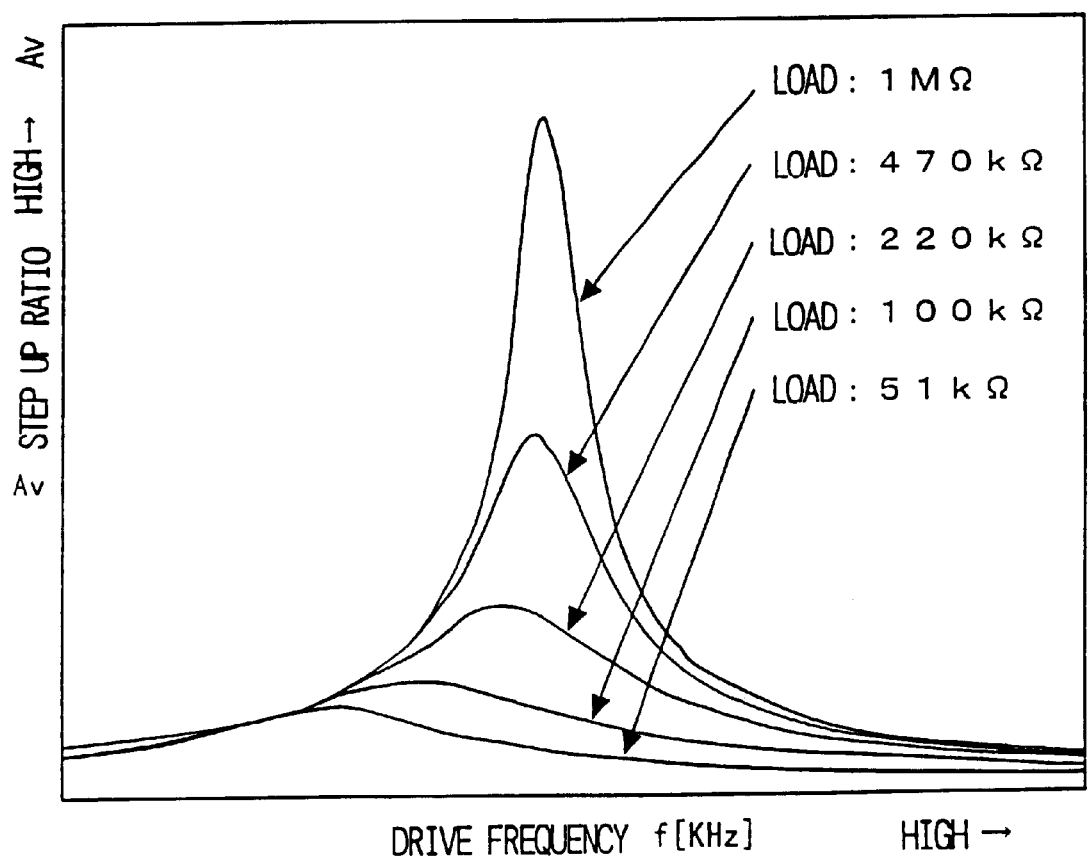
FIG. 10 A graph showing the relationship between the drive frequency, load and the step up ratio of the piezoelectric transformer.

A piezoelectric transformer for driving the cold cathode tube also exhibits the change in characteristics in association with the rapid change in the characteristics of the cold cathode tube. FIG. 10 shows an example of the change in the step up ratio of the piezoelectric transformer due to the change in the load impedances. As the load impedance increases, the piezoelectric transformer has a high step up ratio so that the output voltage increases. In FIG. 10, abscissa denotes the drive frequency of the piezoelectric transformer and ordinate denotes the step up ratio.

Accordingly, the piezoelectric transfomer exhibits a high step up ratio and high voltage output before the start of lighting of the cold cathode tube and low step up ratio and low output voltage after lighting thereof.

Figure 9:
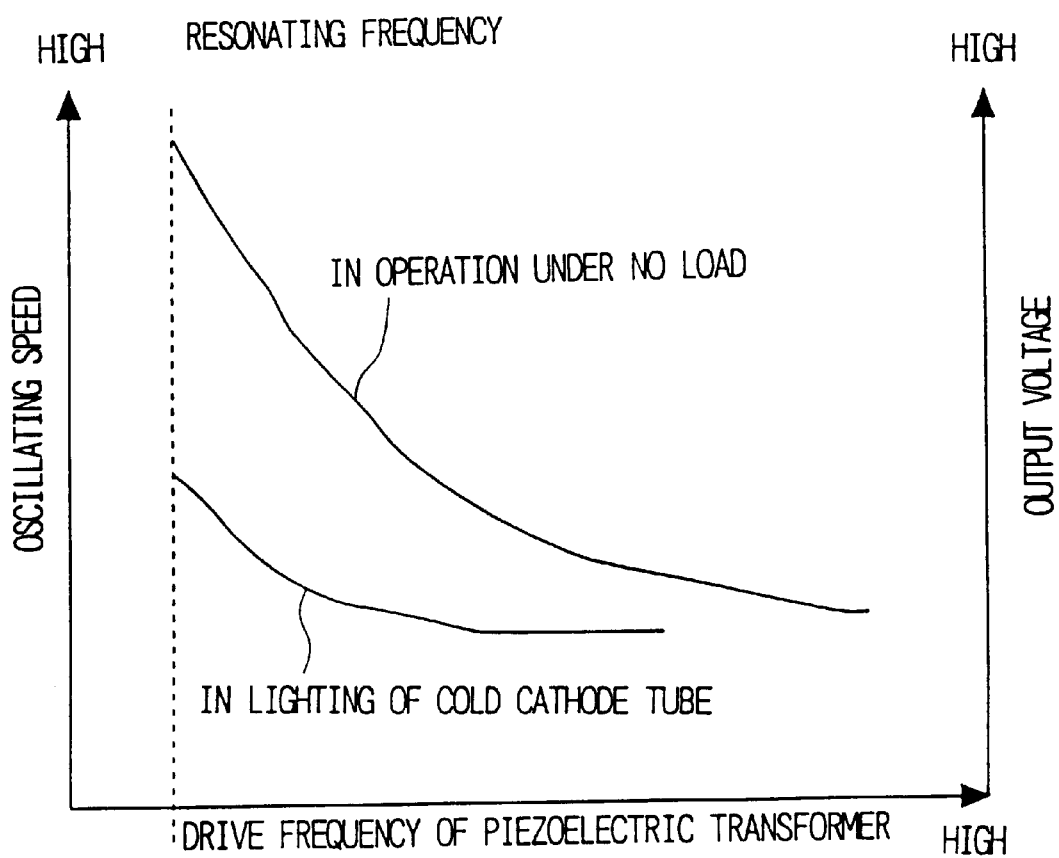
FIG. 9 A graph showing the relationship between the drive frequency, oscillating speed and the output voltage of the piezoelectric transformer.

The piezoelectric transformer has a proportional relationship between its output voltage and oscillating speed in the practical range. Its example is shown in FIG. 9. In FIG. 9, abscissa denotes the drive frequency of the piezoelectric transformer and the ordinate denotes (right) oscillating speed (left) and the output voltage.

Since the cold cathode tube has a very high impedance before start of lighting as mentioned above, the oscillatory speed of the piezoelectric transformer before activation is higher in comparison with that after lighting. The oscillating speed is very high particularly in the vicinity of resonating frequency. If a time lag should occur until the start of discharge in the cold cathode tube, the piezoelectric transformer might be broken due to excessive oscillation. Accordingly, it is preferable to start the driving at a low frequency in which the oscillating speed is low, that is, the step up ratio is low when the piezoelectric transformer inverter is activated.

Now, the preferable frequency sweeping direction on activation will now be described.

Since the driving of the piezoelectric transformer is started from a frequency in which the step up ratio is low on activation as mentioned above, an output which satisfies the lighting voltage of the cold cathode tube is not generated, so that the current flowing across the cold cathode tube is insufficient.

Figure 13:
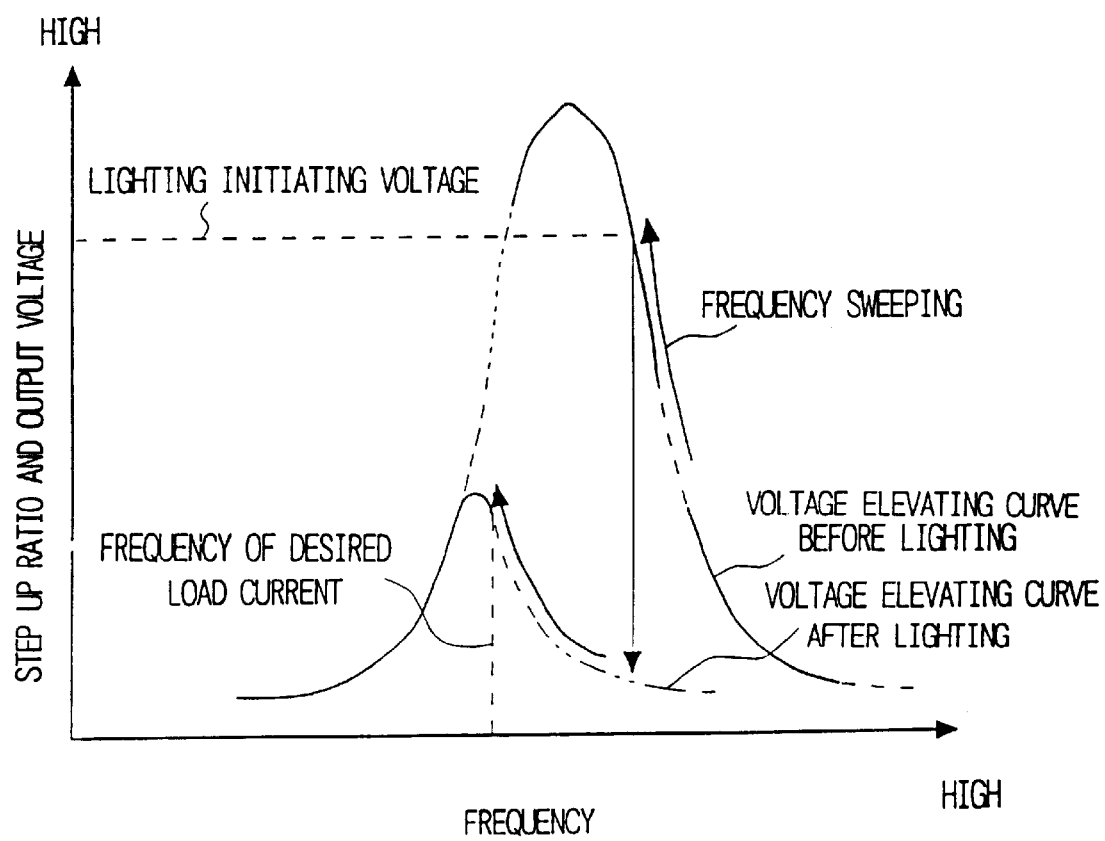
FIG. 13 A graph explaining the principle and background technology of the present invention.
Figure 14:
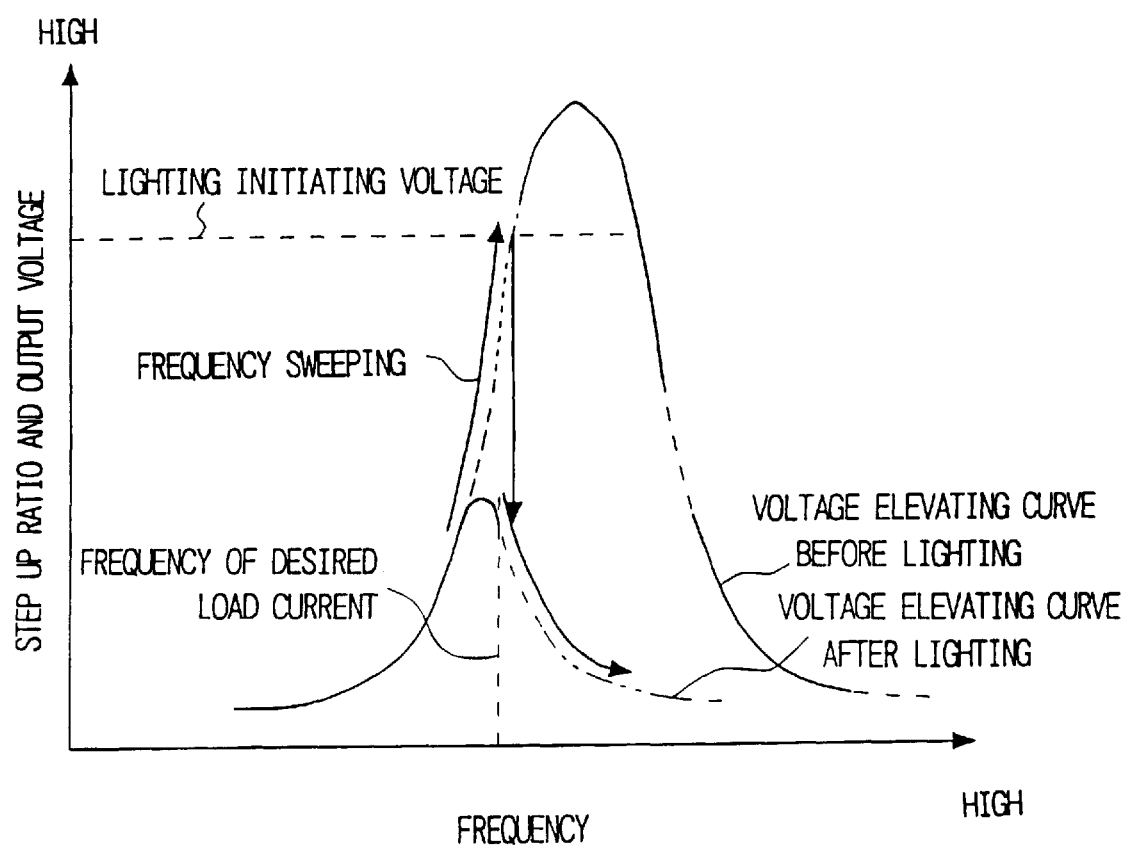
FIG. 14 A graph explaining the principle and background technology of the present invention.

Two modes of direction for sweeping the frequency are now considered i.e., one mode as shown in FIG. 13 and another mode as shown in FIG. 14, aiming at frequency sweeping so as to reach the light-start voltage of the cold cathode tube to let the current to flow. FIG. 13 shows a frequency sweeping direction so that the driving is started from a frequency which is remarkably higher than the resonating frequency of the piezoelectric transformer towards the low frequency. FIG. 14 shows a frequency sweeping direction so that the driving is started from a frequency which is remarkably lower than the resonating frequency of the piezoelectric transformer towards an elevated frequency. That is, the both frequency sweeping directions are opposite at the time of detection that the current flowing across the load is insufficient. In FIGS. 13 and 14, abscissa denotes the driving frequency and ordinate denotes the step up ratio and the output voltage.

When the output voltage from the piezoelectric transformer reaches a cold cathode tube lighting initiating voltage after activation and the impedance of the cold cathode tube is rapidly lowered in case where sweeping in a direction shown in FIG. 14 is conducted, the following problem will occur.

If the frequency is such that the frequency is at a value lower than that corresponding to a desired load current after lowering of the impedance of the cold cathode tube as shown in FIG. 14, the frequency is swept again in a direction toward elevating the frequency, so that the current through the load will not be stabilized to the desired load current value.

Figure 15:
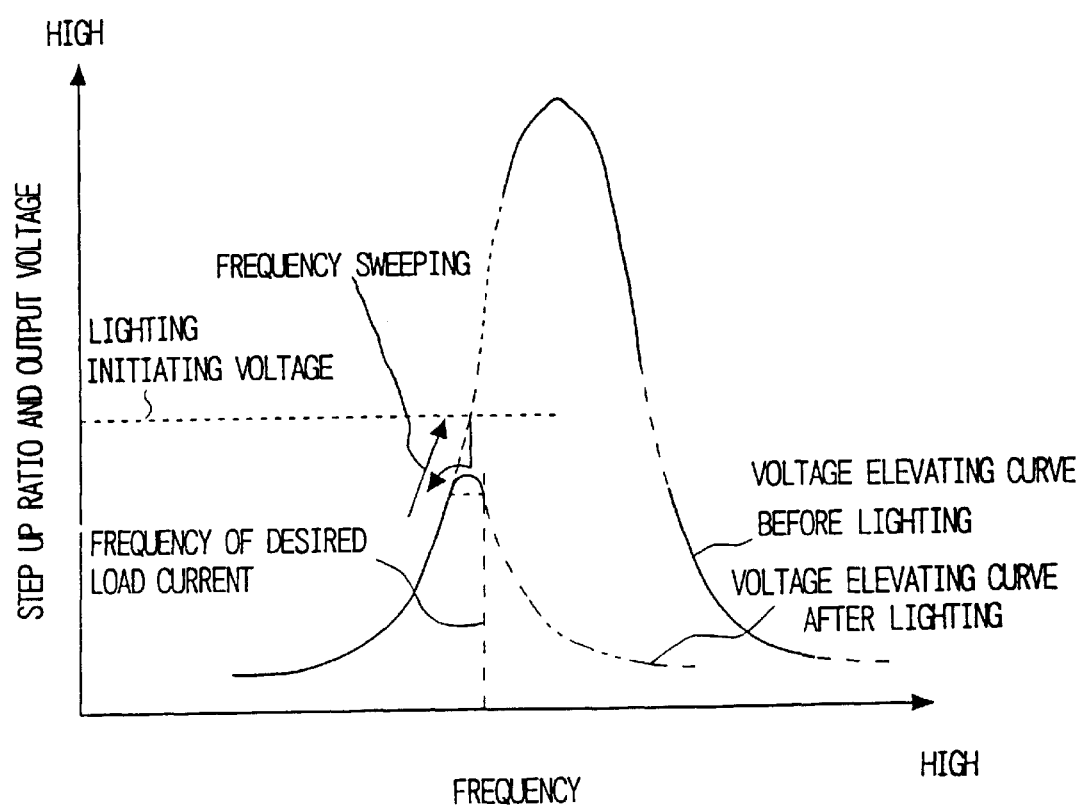
FIG. 15 A graph explaining the principle and background technology of the present invention.
Figure 16:
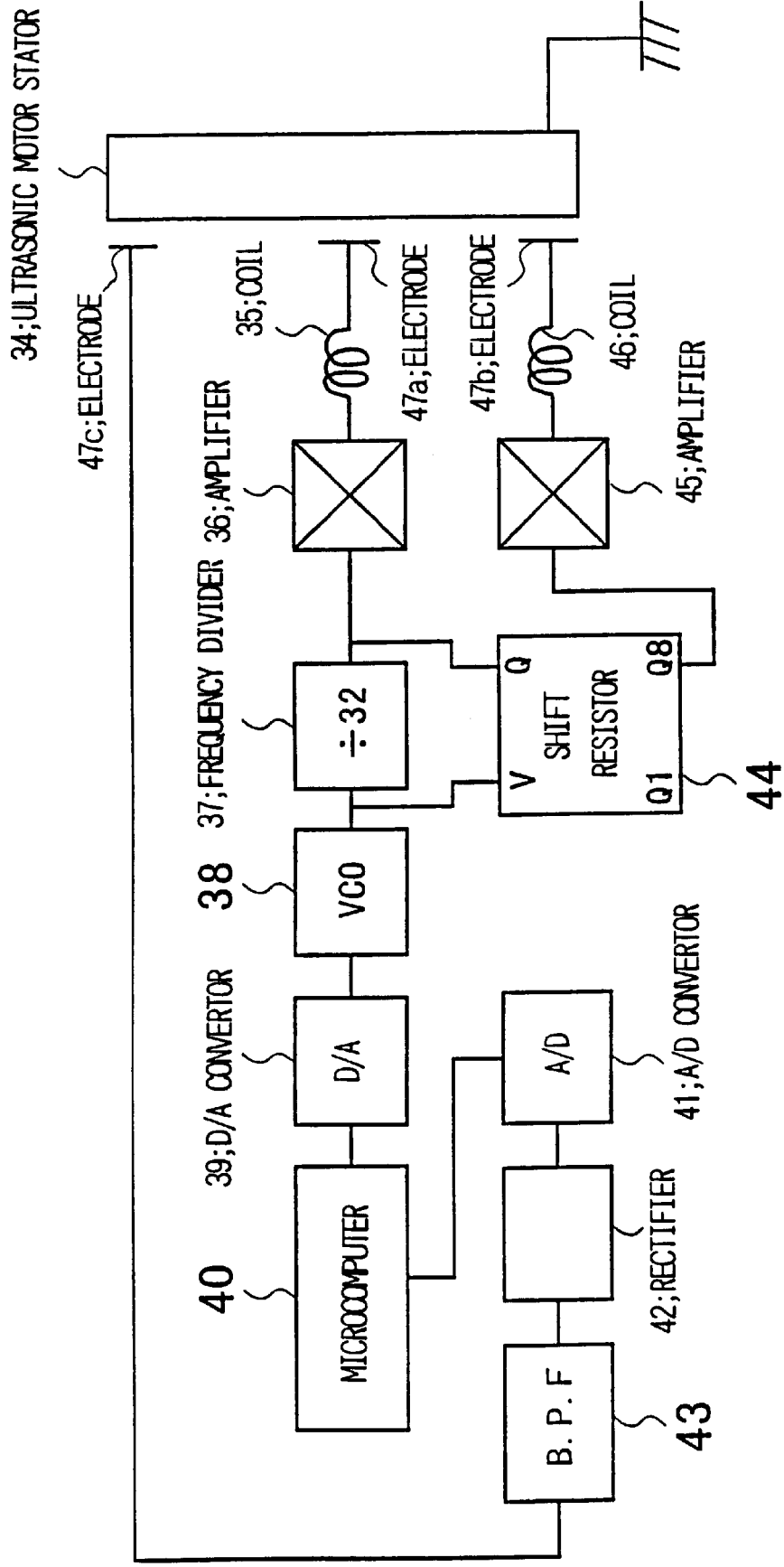
FIG. 16 A diagram showing the configuration of a prior art ultrasonic motor activating circuit.

If the frequency is of a value higher than that corresponding to the desired load current after lowering of the impedance of the cold cathode tube, the frequency is swept in a lowering direction as shown in FIG. 15, so that the frequency is stabilized to such a frequency that the load current is at the desired value which is lower than the resonating frequency.

In this case, a problem occurs in which the output power with respect to the input power (hereinafter referred to as "efficiency") is lowered at a frequency lower than the resonating frequency as shown in FIG. 5, although the efficiency is stabilized at or above frequency corresponding to the desired load current.

From the foregoing, it is preferred to conduct sweeping in such a manner that the frequency is lowered by initiating driving from a frequency which is sufficiently higher than the resonating frequency as shown in FIG. 13.

Now, a preferred combination of a voltage controlled oscillating circuit (VCO) with its control circuit will be described.

It is prefered to conduct sweeping in such a manner that the frequency is lowered by initiating the driving of the piezoelectric transformer inverter from a frequency which is sufficiently higher than the resonating frequency on activation thereof as mentioned above. In this case, it is prefered to use a VCO having characteristics in which the oscillating frequency is lowered as the input voltage increases as shown in FIG. 6.

The reason is that the voltage for controlling the VCO is 0 V since the voltage of the power source which is supplied to the inverter before the activation thereof is also 0, and the voltage for controlling the VCO begins to increase after the power is supplied to the power source after activation by starting from such condition.

Figure 7:
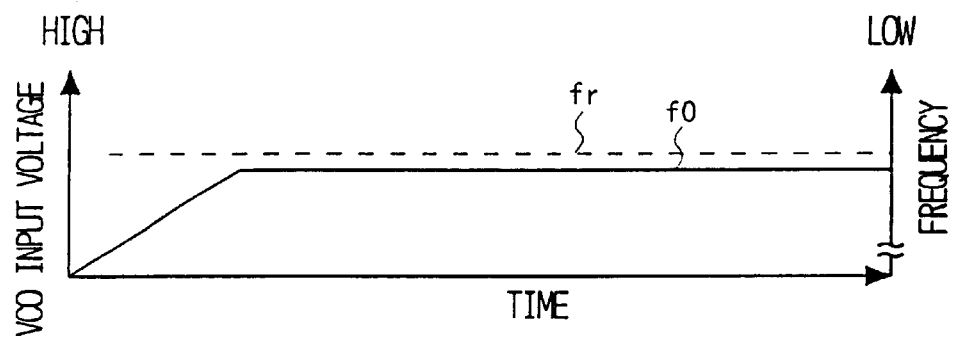
FIGS. 7(a)–7(c) Diagrams explaining the operation in one embodiment of the present invention and showing wave forms of a signal of the VCO input voltage and oscillation frequency.
Figure 7:
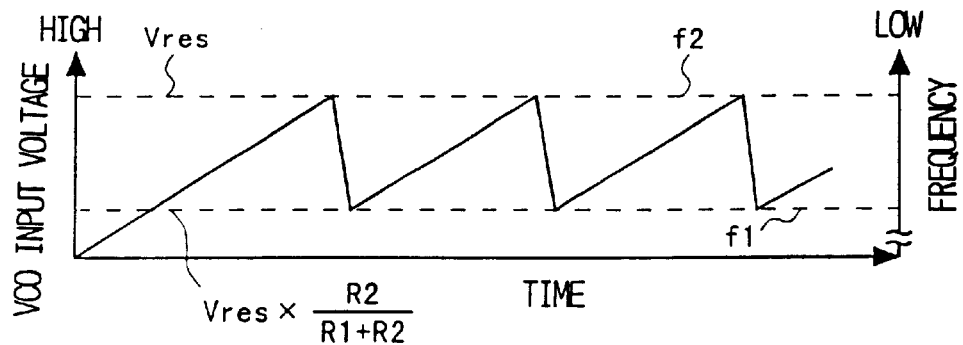
Figure 7:
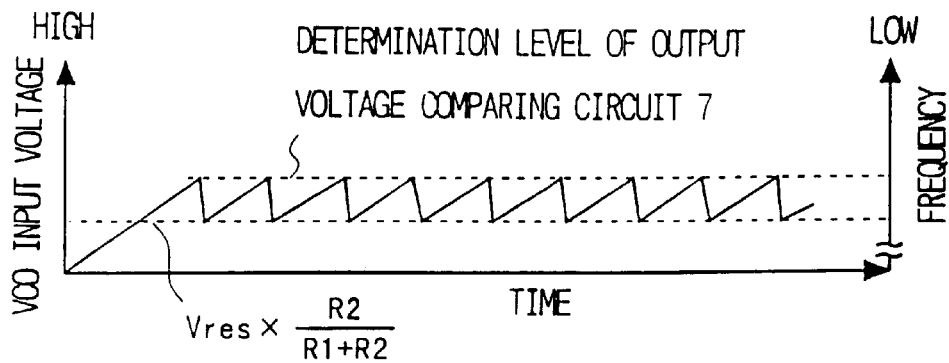

If the VCO having the characteristics in which the oscillating frequency is lowered as the input voltage increases is used, sweeping can be conducted so that the frequency is lowered by starting the driving from a frequency which is sufficiently higher than the resonating frequency on activation as shown in FIG. 7(*a*). FIG. 7 shows the wave form of the VCO input voltage (and the oscillating frequency of VCO).

Figure 6:
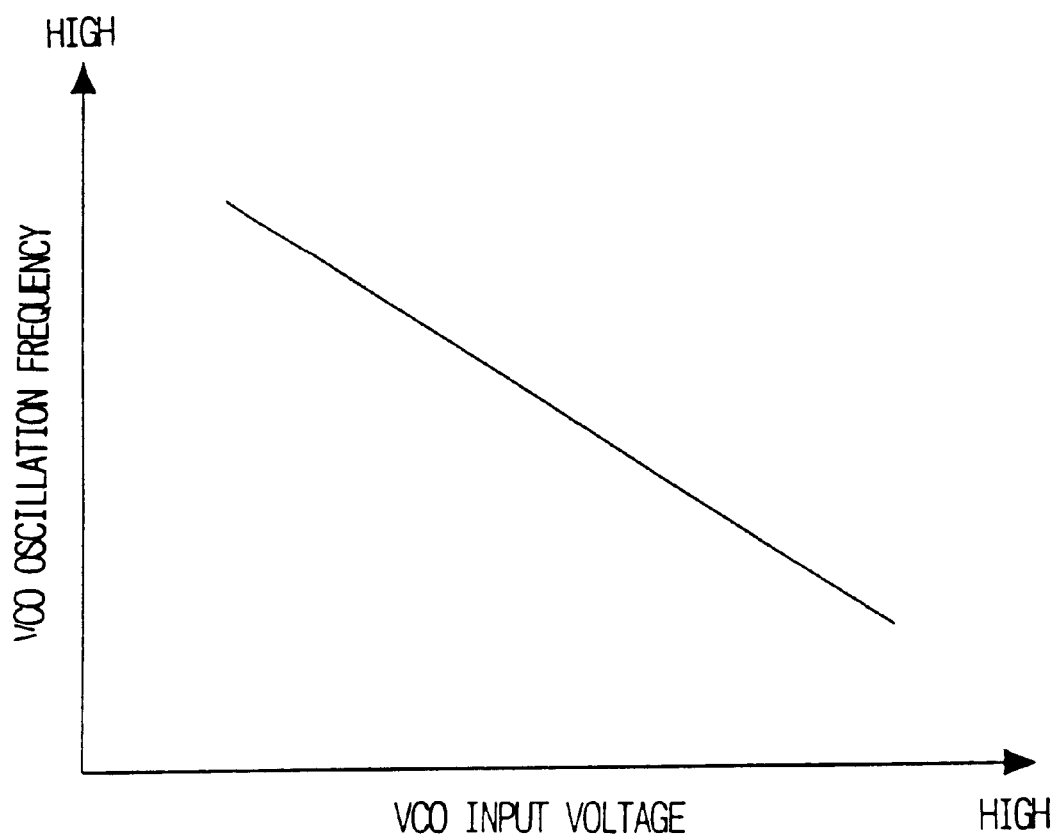
FIG. 6 A graph showing the relationship between the VCO input voltage and the VCO oscillation frequency in one embodiment of the present invention.

If the VCO has characteristics as shown in FIG. 11(*a*) in which the oscillating frequency is proportional to the control voltage conversely with those shown in FIG. 6, a circuit having an activating time constant such as timer circuit would be necessary to prevent the frequency from passing across the resonating frequency.

The VCO is advantageously simpler in circuit configuration, having the characteristics shown in FIG. 6, in which the load current reaches the desired value before the driving frequency which is a resonating frequency fr at which the oscillating speed of the piezoelectric transformer is high as shown in FIG. 7(*a*).

Now, prevention of the excessive oscillation when the load impedance is high will be described.

Since the load current is not fed back under non-loading condition, the frequency is continued to lower upon determining that the load current is lacking in a system in which the frequency is controlled depending upon the amplitude of the load current. Since the oscillating speed in non-loading operation is higher than that when the load is connected as shown in FIG. 9, the oscillating speed ultimately becomes excessive so that the piezoelectric transformer will be broken.

Accordingly, it is necessary to control the lowering of the frequency to a value without practically causing any problem in non-loading operation.

Therefore, the control system should be capable of outputting the cold cathode tube lighting initiating voltage and simultaneously preventing the deterioration of the piezoelectric transformer characteristics due to excessive oscillation when the transformer is not loaded or the load impedance is high.

Since the probability of reconnection of a load is less when the piezoelectric transformer is upon changing into "open" state of the load, no problem would occur even if driving of the piezoelectric transformer is terminated when no load condition is detected by any method.

However, it may take some period of time until the impedance of the cold cathode tube is gradually lowered and ultimately initiates lighting after a voltage for starting lighting of the cold cathode tube is supplied depending upon the characteristics of the cold cathode tube. In other words, momentary termination of the output when the load impedance is high will practically cause a problem.

The present invention accomplishes the prevention of the breaking down of the piezoelectric transformer due to excessive oscillation on activation and simultaneously enhancement in efficiency in a method and circuit for driving a piezoelectric transformer having a high load dependent characteristic, to which a cold cathode tube having high impedance variation is connected as a load. In the present invention, there are provided control means for controlling a load power to a constant value and means for initiating driving the piezoelectric transformer at a frequency higher than a resonating frequency on activation and thereafter gradually lowering the frequency (frequency lowering direction sweeping oscillator 6 in FIG. 1), to control the frequency so that it will not pass across the piezoelectric transformer resonating frequency on its activation.

Figure 1:
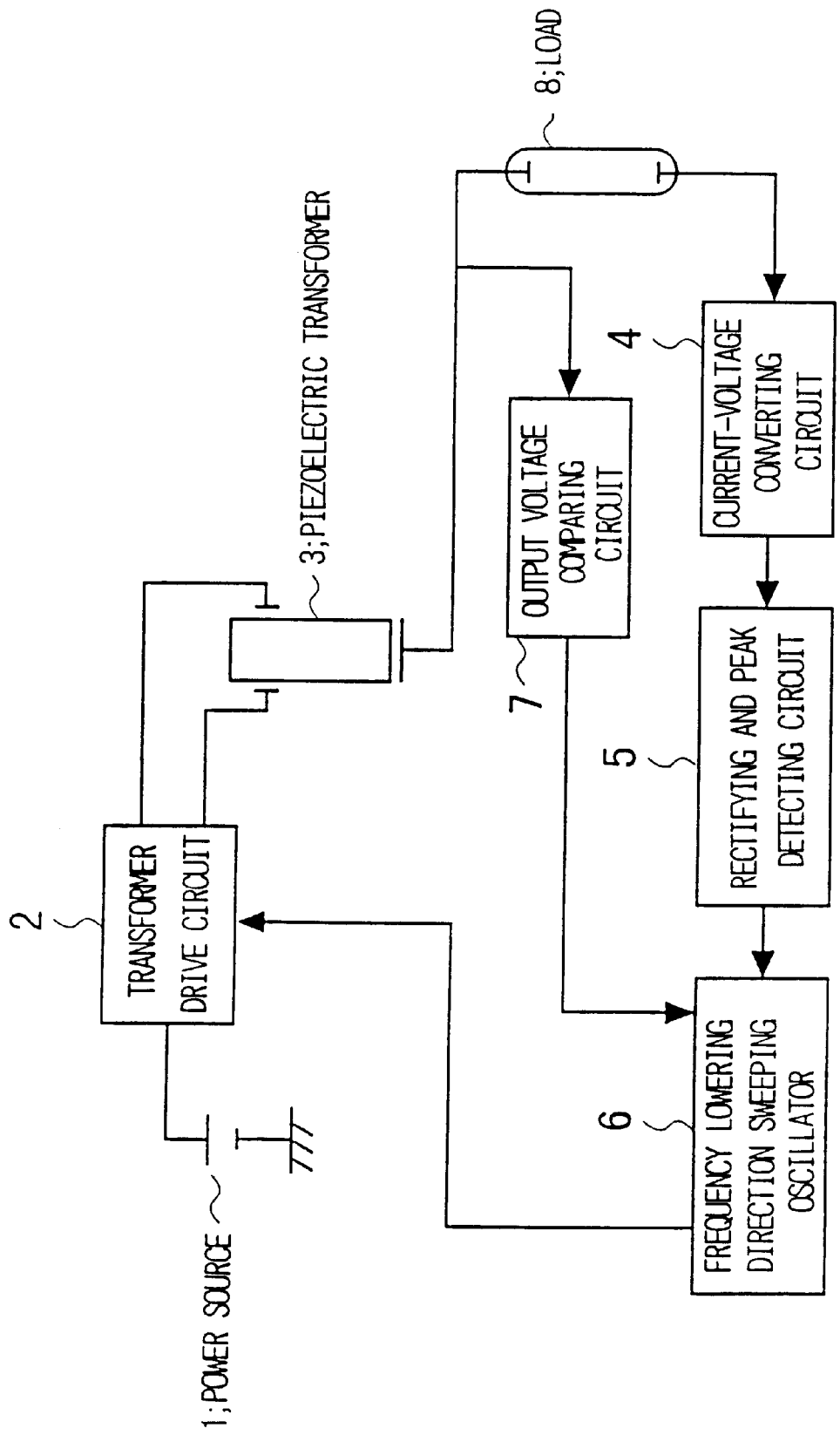
FIG. 1 A diagram showing the configuration of one embodiment of the present invention.

In the present invention, the controlling means is configured to control the load current to a constant value at a frequency which is higher than the resonating frequency of the piezoelectric transformer (a current-voltage converting circuit 4, rectified peak detecting circuit 5 and frequency lowering direction sweeping oscillator 6 in FIG. 1).

In the present invention, the control means for initiating the driving of the piezoelectric transformer at a frequency higher than the resonating frequency on its activation and thereafter for gradually lowering the frequency (the frequency lowering direction sweeping oscillator 6 in FIG. 1) comprises an input control circuit (as denoted by reference numeral 9 in FIG. 2) of a voltage controlled oscillator (hereinafter referred to as "VCO") which initiates operation when the output is 0 V on activation.

In the present invention, the controlling means comprises a VCO (as denoted by reference numeral 10 in FIG. 2), the output frequency of which is lowered as the input voltage increases.

The present invention further comprises means for controlling the load power to a constant value. In the piezoelectric transformer drive circuit for initiating the driving of the piezoelectric transformer at a frequency higher than the resonating frequency on its activation and thereafter for gradually lowering the frequency, the controlling means comprises means for controlling the driving of the piezoelectric transformer so that the driving of the piezoelectric transformer is not initiated on its activation until the piezoelectric transformer drive frequency reaches an upper limit frequency (a timer circuit 49 in FIG. 11).

In the present invention, the controlling means controls the drive frequency of the piezoelectric transformer so that it will not pass across the resonating frequency of the piezoelectric transformer on its activation by the control means including the VCO and timer 11. The driving of the piezoelectric transformer is not initiated until the drive frequency reaches a level which is a predetermined amount higher than the resonant frequency, of the piezoelectric transformer.

In the present invention, the controlling means controlling the load current to a constant value at a frequency higher than the resonating frequency of the piezoelectric transformer by means which will not initiate the driving of the piezoelectric transformer until the driving frequency of the piezoelectric transformer reaches the upper limit frequency on activation of the transformer.

In the present invention, the controlling means comprises a VCO which elevates the output frequency as the input voltage increases. The controlling means includes a timer circuit which will not activate the VCO until a predetermined period of time has passed after turning on of the power source. Now, the present invention will be described in detail with reference to an embodiment thereof.

Embodiments

FIG. 1 is a block diagram showing the configuration of one embodiment of the present invention. The piezoelectric transformer has characteristics that its resonating frequency and its step up ratio change depending upon the load impedance as shown in FIG. 10. In a drive circuit in one embodiment of the present invention, the piezoelectric transformer inverter comprises a piezoelectric transformer 3 which converts an ac voltage which is input from its primary side and outputs the converted voltage at its secondary side by using its piezoelectric effect, a transformer drive circuit 2 which is connected to input electrodes of the piezoelectric transformer for converting the voltage of the power source into a necessary input voltage of the piezoelectric transformer so that the piezoelectric transformer 3 provides a predetermined output responsive to a control signal from a frequency lowering direction sweeping oscillator 6, a load 8 which is connected to an output electrode of the piezoelectric transformer for receiving the output from the piezoelectric transformer 3 and supplying a load current to a current-voltage converting circuit 4, a current-voltage converting circuit 4 which is connected to the load 8 for receiving the load current and to compare it with a desired value and for outputting the result of comparison to a rectifying and peak detecting circuit 5, a rectifying and peak detecting circuit 5 for receiving the voltage output from the current-voltage converting circuit 4 to rectify it and thereafter conducting peak detection to output its result to the frequency lowering direction sweeping oscillator 6, a frequency lowering direction sweeping oscillator 6 which receives signals from the rectifying and peak detective circuit 5 and an output voltage comparing circuit 7 to output a signal of the driving frequency of the piezoelectric transformer 3 to the transformer drive circuit 22 and an output voltage comparing circuit 7 for outputting a signal for returning the drive frequency of the piezoelectric transformer 3 to the upper limit frequency in the sweeping range to the frequency lowering direction sweeping oscillator 6, if it detects an output excessive voltage of the piezoelectric transformer 3.

Figure 2:
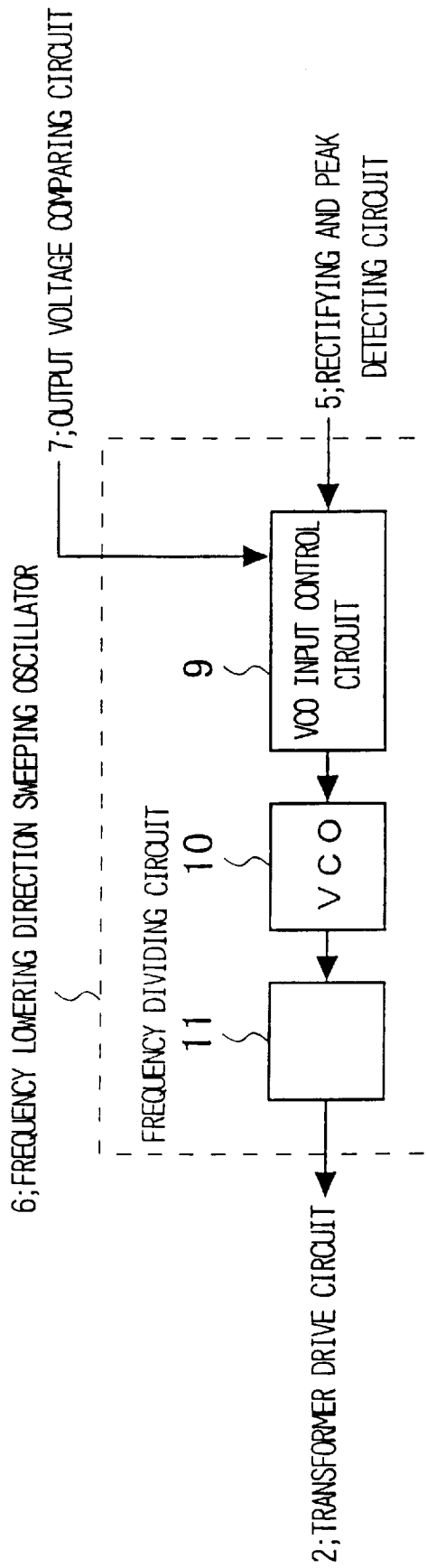
FIG. 2 A diagram showing the configuration of the frequency lowering direction sweeping oscillator.

FIG. 2 is a block diagram showing an exemplary configuration of the frequency lowering direction sweeping oscillator 6 in one embodiment of the present invention. Referring to FIG. 2, the frequency lowering direction sweeping oscillator 6 comprises a VCO input control circuit 9, a VCO 10 and a frequency dividing circuit 11. The frequency dividing circuit 11 is adapted to divide frequency signal from the VCO 10 and to output the dividing frequency signal to the transformer drive circuit 2.

Figure 3:
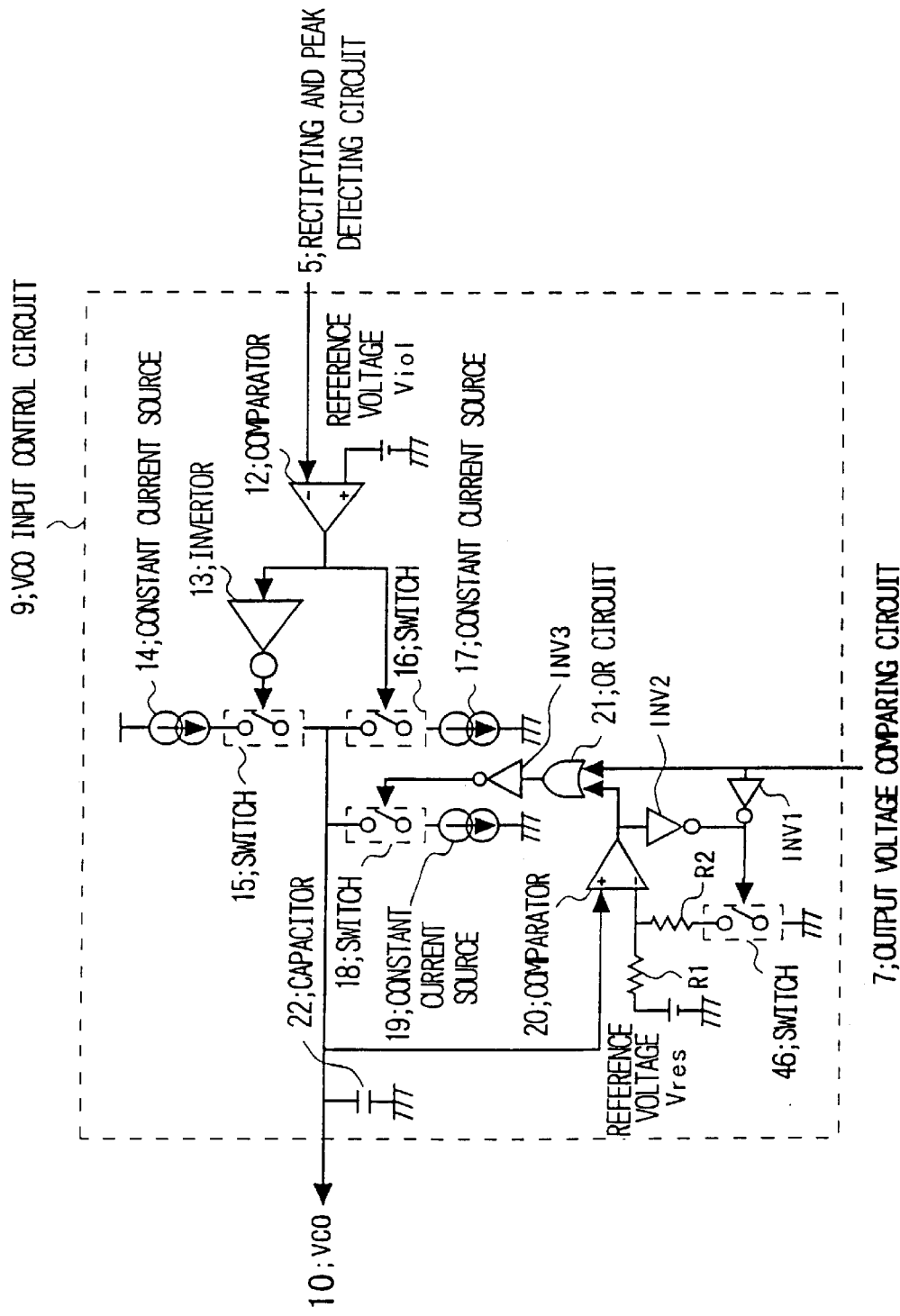
FIG. 3 A diagram showing the configuration of the VCO input voltage controlled circuit in one embodiment of the present invention.
Figure 4:
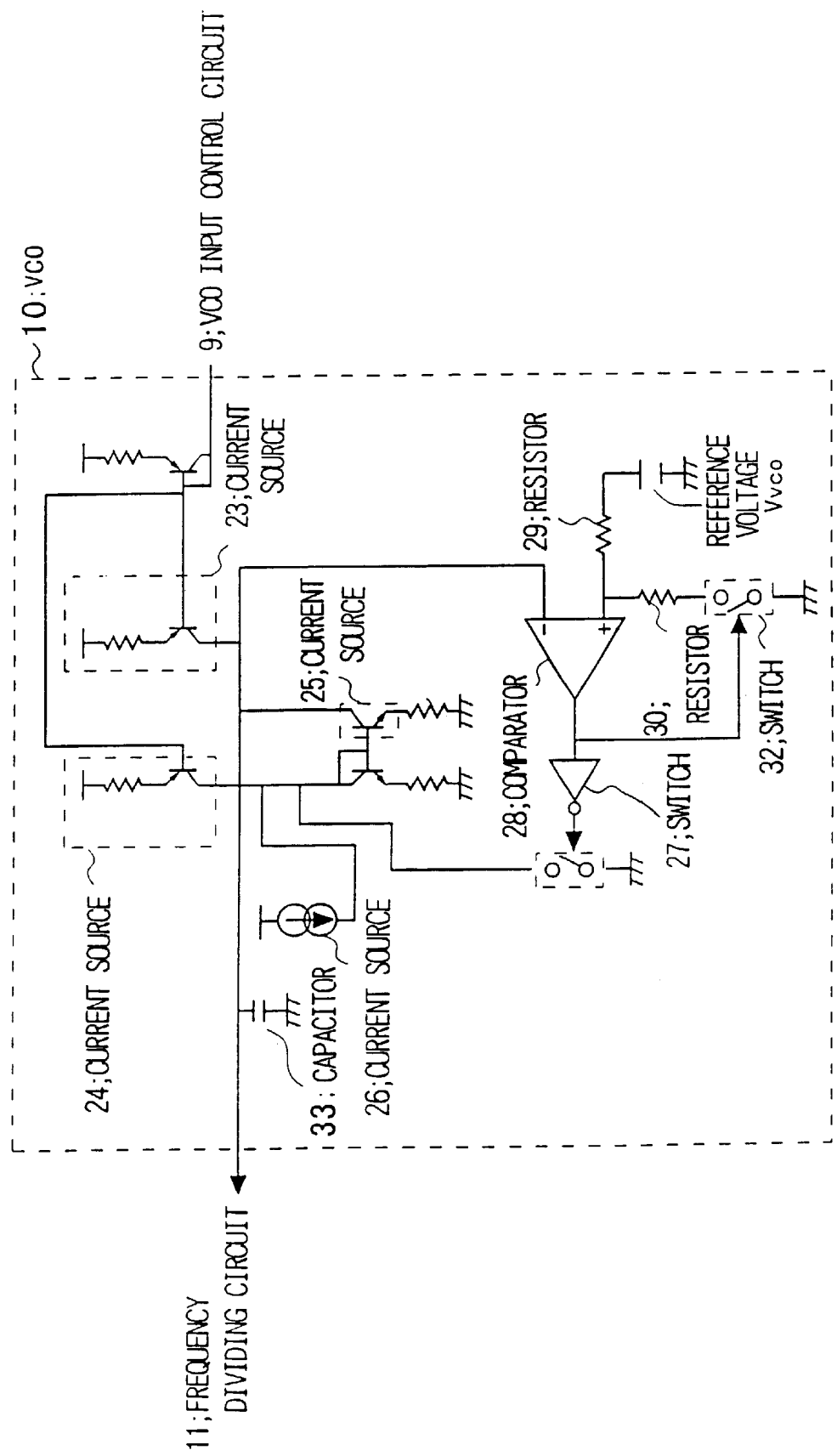
FIG. 4 A diagram showing the configuration of the VCO in one embodiment of the present invention.

FIG. 3 is a diagram showing an exemplary configuration of the VCO input control circuit 9 in one embodiment of the present invention. FIG. 4 is a diagram showing an exemplary configuration of the VCO 10 in one embodiment of the present invention. All the switches shown in FIGS. 3 and 4 are opened and closed when the control signal is at H (high) and L (low) levels, respectively.

Referring to FIG. 3, the VCO input control circuit 9 receives a signal from the rectifying and peak detecting circuit 5, which is proportional to the amplitude of the load current. As the load current increases, the amplitude of the voltage received from the rectifying and peak detecting circuit 5 increases. This voltage is compared with Viol which corresponds to a predetermined desired load current value by the comparator 12.

When the load current is lower than the desired value, the comparator 12 outputs a signal at an H level. The H level signal causes a switch 15 to be closed via an inverter 13 and a switch 16 to be opened. A current from a constant current source 14 causes a capacitor 22 to be charged with an electrostatic charge so that the output voltage to the VCO 10 increases.

When the load current is higher than the desired value, the comparator 12 outputs an L level signal. The L level signal causes the switches 15 and 16 to be opened and closed, respectively. The electrostatic charge which has been charged in the capacitor 22 is discharged by the operation of a constant current source 17, so that the voltage output to the VCO 10 is lowered.

Referring now to FIG. 4, the VCO 10 is configured so that the currents flowing through the current sources 23 and 24 are changed depending upon a voltage from the VCO input control circuit 9. Since the amount of current flowing from the current source 23 is less as the amplitude of the voltage from the VCO input control circuit 9 increases, the charging of the capacitor 33 proceeds slowly. When the voltage across the capacitor 33 becomes higher than Vvco, the output from the comparator 28 becomes the L level so that the switch 27 which is controlled through the inverter is opened. This causes a current source 25 which is a sum of the current sources 24 and 26 to be activated. Since the current from the current source 25 is preset to be higher than the current from the current source 23, the voltage across the capacitor 33 is lowered. On the other hand, the switch 32 is closed by the L level output from the comparator 28, so that the voltage on the non-inverting input terminal of the comparator 28 becomes a voltage which is represented by Vvco×resistor 30/(resistor 29 and resistor 30). The voltage across the capacitor 33 is lowered to a value equal to this value and comparator 28 outputs again the H level signal.

Outputting of the H level signal from the comparator 28 causes the switch 27 to be closed so that no current flows from the current source 25, to elevate the voltage across the capacitor 33. Since the voltage on the non-inverting input terminal of the comparator 28 becomes Vvco by the H level signal output from the comparator 28, the voltage across the capacitor 33 is increased to this value, whereupon the comparator 28 provides an L level signal again at its output.

Repeating of the above-mentioned operation causes VCO 10 to output a triangular wave form signal. The VCO 10 shown in FIG. 4 exhibits characteristics in which the frequency of the output triangular signal is low as the magnitude of the voltage from the VCO input control voltage 9 becomes higher.

Figure 8:
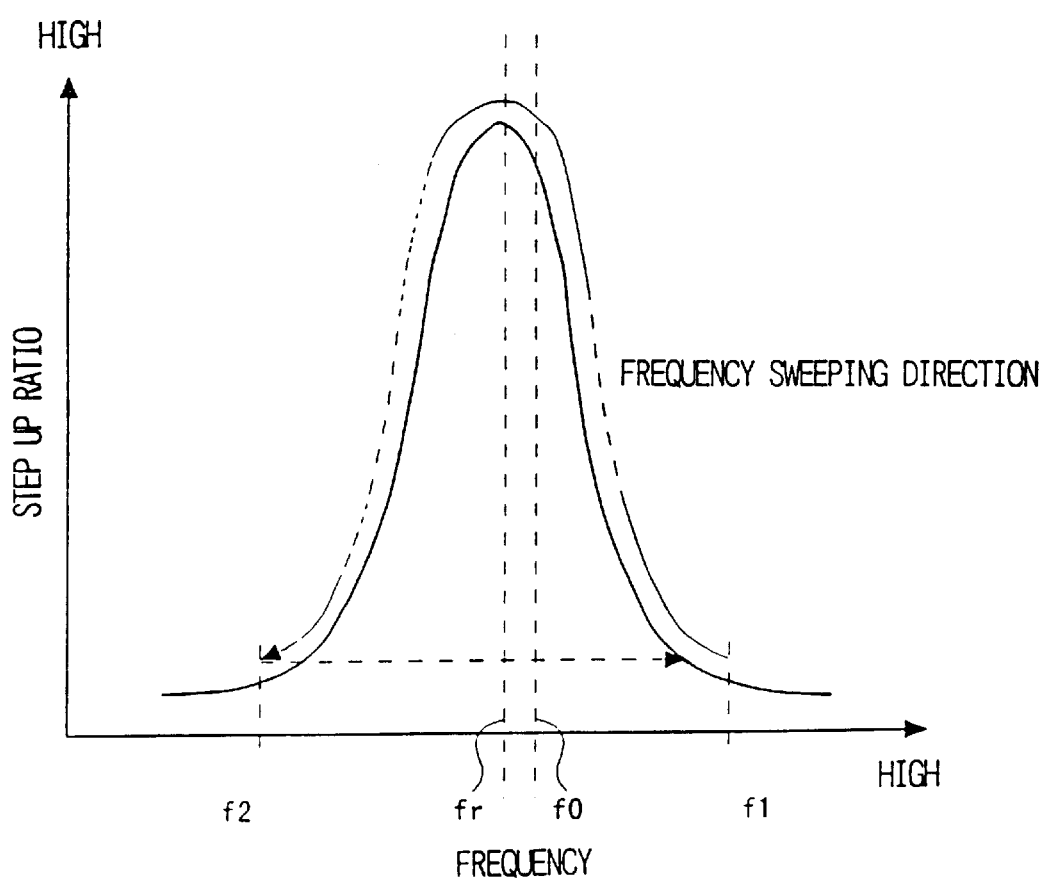
FIG. 8 A graph explaining the operation in one embodiment of the present invention.

By combining the VCO input control circuit 9 shown in FIG. 3 with the VCO 10 shown in FIG. 4, the voltage input to the VCO is 0 V upon activation of the inverter so that the VCO 10 oscillates at a maximum frequency. At this instance no current is fed back, and the frequency of the VCO ic lowered by gradually increasing the voltage input to the VCO by the output from the VCO input control circuit 9. Then, sweeping of the frequency is stopped when a desired load current is obtained. The operation which has been described above is shown in FIG. 7(a). f0 in FIG. 7(a) denotes a frequency f0 at which the desired value of the load current shown in FIG. 8 is obtained, and fr denotes a resonating frequency of the piezoelectric transformer having the highest step up ratio.

Accordingly, by combining the VCO input control circuit 9 in which its output started from 0 V on activation thereof with the VCO 10 having an output frequency which is lowered with the increase in an input voltage, an oscillating frequency at which a desired load current value can be obtained on the frequency range higher than the resonating frequency, without passing across the resonating frequency (fr) of the piezoelectric transformer on its activation.

Since the oscillation frequency will not pass across the resonating frequency in such a manner in accordance with one embodiment of the present invention, the breaking down of the piezoelectric transformer due to excessive oscillation can be prevented. A higher efficiency can be obtained due to the fact that the desired value of the load current is obtained at a frequency higher than the resonating frequency. The reason why the advantages are obtained has been described above.

Referring to FIG. 3 again, when the voltage across the capacitor 22 exceeds the reference voltage Vres in the VCO input control circuit 9, the output of the comparator 20 assumes an H level. This causes the switch 18 to be closed through an OR circuit 21 and an inverter INV3. Since the current from the constant current source 19 is higher than those from the constant current sources 14 and 17, the voltage across the capacitor 22 is rapidly lowered. Simultaneously with this, the switch 46 is closed through an inverter INV2 by the H level signal output from the comparator 20, so that the voltage on the inverting output terminal of the comparator assumes a voltage as represented by Vres×R2/(R1+R2), and the voltage across the capacitor 22 is lowered to reach this value.

When the voltage across the capacitor becomes lower than the value as represented by Vres×R2/(R1+R2), the output of the comparator 20 assumes the L level again so that the constant current source 19 is interrupted by opening of the switch 18, and the voltage across the capacitor 22 is elevated again.

Sweeping of the frequency is repeated as shown in FIG. 7(b) by the above-mentioned operation if the desired value of the load current can not be obtained, for example, due to insufficient power input to the piezoelectric transformer. f1 and f2 in FIG. 7(b) denote the upper and lower limits f1 and f2 in the sweeping frequency range, respectively.

Now, the output voltage comparing circuit 7 outputs an H level signal at the instant when the piezoelectric transformer outputs a voltage which has been preset by the output voltage comparing circuit 7 if the system is activated under no load condition or the cold cathode tube keeps a high impedance.

The voltage value Vpre which has been preset by the output voltage comparing circuit 7 should be not less than a value which is required to initiate lighting of the cold cathode tube and not higher than a value at which the piezoelectric transformer 3 may be broken due to excessive oscillating.

This signal from the output voltage comparing circuit 7 is input to the OR circuit 21 of the VCO input control circuit 9. This enables the constant current source 19 to operate (by closure of switch 1g) so that the voltage acros, the capacitor 22 is lowered to reach Vres×R2/(R1+R2). Thereafter, the voltage input to the VCO begins to rise again. This operation is shown in FIG. 7(c).

Accordingly, control in which breaking down of the piezoelectric transformer due to excessive oscillation can be prevented and the effective value of the oscillating speed is suppressed low while intermittently outputting the lighting initiating voltage for the cold cathode tube can be achieved by combining the VCO input control circuit 9 with the VCO 10 which are shown in FIGS. 3 and 4, respectively.

Figure 11A:
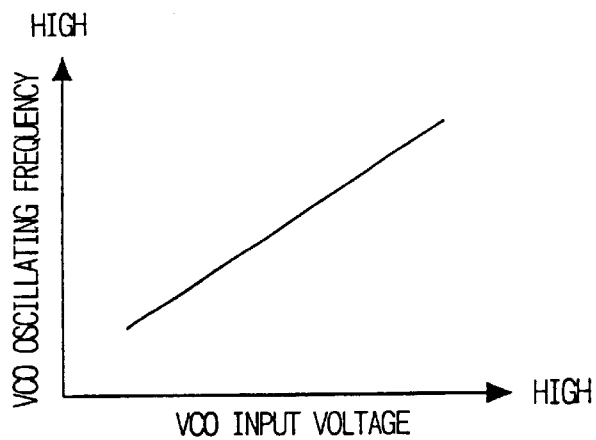
FIG. 11(a) shows the characteristics of VCO.
Figure 11B:
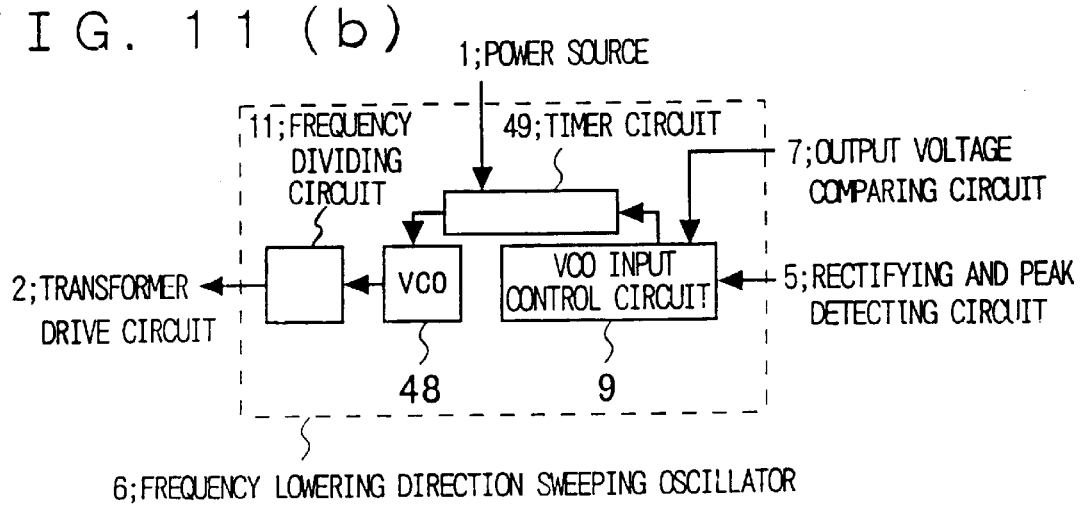
FIG. 11(b) shows the configuration of the frequency lowering direction sweeping oscillator.

Another embodiment of the present invention will now be described. The frequency lowering direction sweeping oscillator 6 is configured as shown in FIG. 11(b) in case where the system uses a VCO 48 having characteristics in which the output frequency is elevated as the input voltage is elevated as shown in FIG. 11(a). The output of the VCO input control circuit 9 is input to the VCO 48 via a timer circuit 49.

Figure 11C:
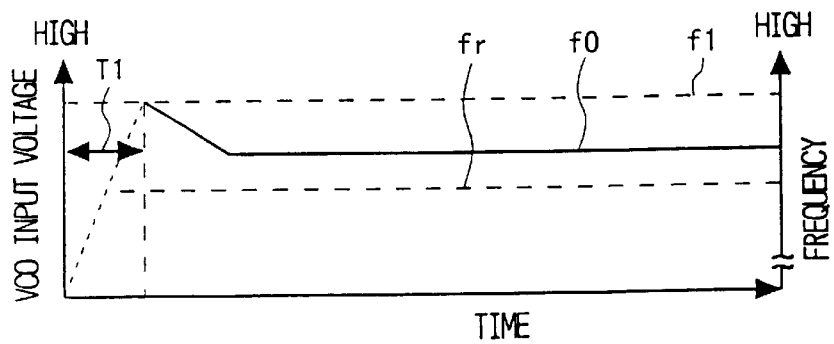
FIG. 11(c) shows the wave form of the VCO input voltage.

The timer circuit 49 is adapted to open a path between the VCO input control circuit 48 and the power source 1 until a period of time T1 lapses after a voltage from the power source 1 is applied and to close the path between the VCO input control circuit 9 and the VCO 48 after the lapse of the period of time T1. The period of time T1 is a period of time which is taken for the VCO input voltage to reach the upper limit value as shown in FIG. 11(c). By this operation, the VCO 48 initiates its oscillation from the upper limit value in the sweeping frequency range. This causes the oscillation frequency of the VCO 48 to reach the frequency f0 with the desired load current in a frequency range higher than the resonating frequency without passing across the vicinity of the resonating frequency of the piezoelectric transformer.

Although the VCO input control circuit 9 is configured as shown in FIG. 3 in this case, it is preset to decrease the speed at which the VCO control voltage is lowered and to increase the speed at which the VCO control voltage is elevated by changing the value of the current from the constant current source.

The meritorious effect of the present invention are summarized as follows.

As aforementioned, in accordance with the present invention, meritorious advantages are obtained generally in the piezoelectric transformer inverter using the piezoelectric transformer which is characteristic of high load dependence and to which the cold cathode tube having high impedance variations is connected as its load. Namely, the advantages reside in that the brightness of the cold cathode tube can be controlled to a constant value by means of observing the value of the load current and that breaking down of the piezoelectric transformer can be prevented by means of lighting the cold cathode tube, without passing across a frequency at which the oscillating speed of the piezoelectric transformer is high on its activation. This is achieved by combining the VCO input control circuit having its output starting from 0 V and the VCO having its output frequency being lowered as the input voltage is elevated.

In accordance with the present invention, in addition to above-mentioned advantages, another advantage is obtained in which a higher efficiency is obtained by means for presetting the drive frequency at a frequency higher than the resonating frequency of the piezoelectric transformer by combining the VCO input control circuit with the VCO.

It should be noted that other objects and aspects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A circuit for driving a piezoelectric transformer, wherein said circuit comprises a controller controlling the drive frequency of said piezoelectric transformer so that the driving of the piezoelectric transformer is initiated at a drive frequency which is higher than the resonating frequency of the piezoelectric transformer on activation thereof and thereafter the drive frequency of said piezoelectric transformer is gradually lowered, to control the load power to a constant value.

2. A circuit for driving a piezoelectric transformer as defined in claim 1, wherein said controller controls the drive frequency of said piezoelectric transformer in such a manner that said drive frequency will not pass across the resonating frequency of said piezoelectric transformer on activation thereof.

3. A circuit for driving a piezoelectric transformer as defined in claim 1, wherein said controller controls the load current to a constant value at a drive frequency which is higher than the resonating frequency of said piezoelectric transformer.

4. A circuit for driving a piezoelectric transformer, wherein said circuit comprises means for controlling the drive frequency of said piezoelectric transformer so that the driving of the piezoelectric transformer is initiated at a drive frequency which is higher than the resonating frequency of the piezoelectric transformer on activation thereof and thereafter the drive frequency of said piezoelectric transformer is gradually lowered, said means controlling the drive frequency of said piezoelectric transformer in such a manner that it will not pass through the resonating frequency of said piezoelectric transformer, and controlling means for controlling the load current to a constant value at a frequency which is higher than the resonating frequency of said piezoelectric transformer.

5. A circuit for driving a piezoelectric transformer as defined in claim 1, wherein said controller includes a voltage controlled oscillating circuit VCO input control circuit which outputs a voltage starting from 0 V as an input to the VCO.

6. A circuit for driving a piezoelectric transformer as defined in claim 1, wherein said controller includes a voltage controlled oscillating circuit VCO, the output frequency of which is lowered as the input voltage is increased.

7. A circuit for driving a piezoelectric transformer, wherein said circuit comprises means for controlling the drive frequency of said piezoelectric transformer so that the driving of the piezoelectric transformer is not initiated on activation thereof until the drive frequency of said piezoelectric transformer reaches a drive frequency a predetermined amount higher than the resonating frequency of said piezoelectric transformer, said means controlling the drive frequency of said piezoelectric transformer in such a manner that it will not pass through the resonating frequency of said piezoelectric transformer.

8. A circuit for driving a piezoelectric transformer, wherein said circuit comprises means for controlling the drive frequency of said piezoelectric transformer so that the driving of the piezoelectric transformer is not initiated at a drive frequency which is higher than the resonating frequency of the piezoelectric transformer on activation thereof until the drive frequency of said piezoelectric transformer reaches a drive frequency a predetermined amount higher than the resonant frequency of said piezoelectric transformer, said means controlling the load current to a constant value at a frequency which is higher than the resonating frequency of said piezoelectric transformer.

9. A circuit for driving a piezoelectric transformer as defined in claim 7, wherein said controlling means includes a timer controlling a voltage controlled oscillating circuit so that it is not operated until a predetermined period of time has lapsed after turning on of a power source.

10. A circuit for driving a piezoelectric transformer as defined in claim 7, wherein said controlling means includes a voltage controlled oscillating circuit which outputs a frequency which is increases as the input voltage increases and a timer controlling a voltage controlled oscillating circuit so that it is not operated until a predetermined period of time has lapsed after turning on of a power source.

11. A method of driving a piezoelectric transformer, wherein said method comprises the steps of:

initiating the driving of said piezoelectric transformer at a frequency which is higher than the resonating frequency of said piezoelectric transformer on activation thereof, thereafter gradually lowering said drive frequency, and controlling the drive frequency of said piezoelectric transformer so that it will not pass through the resonating frequency of said piezoelectric transformer on activation thereof.

12. A method of driving a piezoelectric transformer, wherein said method comprises the steps of:

initiating the driving of said piezoelectric transformer at a frequency which is higher than the resonating frequency of said piezoelectric transformer on activation thereof, thereafter gradually lowering said drive frequency, and controlling a load current to a constant value at a frequency which is higher than the resonating frequency of said piezoelectric transformer.

13. A method of driving a piezoelectric transformer as defined in claim 11, wherein said method comprises controlling the drive frequency of said piezoelectric transformer in such a manner that the drive of said piezoelectric transformer is not initiated until the drive frequency of said piezoelectric transformer reaches the upper limit frequency on activation thereof.

14. A drive circuit, wherein it comprises:

a piezoelectric transformer which converts an ac voltage which is input to its primary side and outputs the converted voltage at its secondary side by using its piezoelectric effect, a transformer driver which is connected to the input electrodes of said piezoelectric transformer and which converts the voltage of a power source into a necessary input voltage of said piezoelectric transformer so that said piezoelectric transformer provides a predetermined output, a current-voltage converter which is connected to the load connected to the output of said piezoelectric transformer and which compares a current flowing through the load with a desired value to output the result of comparison, a rectifying and peak detecting circuit which receives the voltage output from the current-voltage converting means to rectify it and thereafter to conduct the peak detection for outputting its result, an output voltage comparator which outputs a signal for returning the drive frequency of said piezoelectric transformer to the upper limit frequency in the sweeping range if the excessive voltage output from said piezoelectric transformer is detected, and a frequency lowering direction sweeping oscillator which receives signals from the rectifying and peak detecting circuit and said output voltage comparing circuit to output a signal of the driving frequency of the piezoelectric transformer to the transformer driver, whereby the drive of said piezoelectric transformer is initiated at a frequency which is higher than the resonating frequency on activation thereof and thereafter the drive frequency of said piezoelectric transformer is gradually lowered.

15. A drive circuit as defined in claim 14, wherein said frequency lowering direction sweeping oscillator comprises:

a VCO input voltage controller which receives the output from said rectifying and a peak detecting means to compare the output of said rectifying and a peak detecting circuit with a predetermined reference value for increasing or decreasing an output voltage depending upon the result of said comparison, and a voltage controlled oscillator VCO, to which the output of said VCO input voltage control means is input as a control voltage for lowering its output oscillating frequency when said control voltage is increased.

16. A drive circuit as defined in claim 15, wherein said VCO input voltage controller includes switch control means for lowering said output voltage when the output voltage of said VCO input voltage control means exceeds a predetermined reference voltage and for increasing the output voltage again when the output voltage reaches a predetermined voltage.

17. A drive circuit as defined in claim 15, wherein said VCO oscillates at a maximum frequency on its activation when the input voltage to said VCO is 0 V, and the oscillating frequency of said VCO is lowered by gradually increasing the input voltage to said VCO with the output from said VCO input voltage control means and sweeping of the frequency is stopped when a desired load current is obtained.

18. A drive circuit as defined in claim 15, wherein said VCO is controlled in such a manner that said VCO is oscillated at the upper limit frequency by lowering the output voltage from said VCO input voltage controller when said VCO input voltage control means receives the output from said output voltage comparator.

19. A drive circuit as defined in claim 14, wherein said frequency lowering direction sweeping oscillator comprises:

VCO input voltage control means which receives the output from said rectifying and peak detecting circuit to compare the output of said rectifying and peak detecting circuit with a predetermined reference value to increase or decrease an output voltage depending upon the result of said comparison, a voltage controlled oscillator VCO or elevating its oscillating frequency as the input voltage is increased, and a timer, said timer opening a path between said VCO input voltage controller and said VCO for a period of time until the VCO input voltage reaches the upper limit value after turning on of the power source and connecting the path between said VCO input voltage controller and said VCO after lapse of said predetermined period of time.

* * * * *